(12) United States Patent
Mitsukura et al.

(10) Patent No.: US 10,388,608 B2
(45) Date of Patent: Aug. 20, 2019

(54) SEMICONDUCTOR DEVICE AND METHOD FOR MANUFACTURING SAME

(71) Applicant: HITACHI CHEMICAL COMPANY, LTD., Tokyo (JP)

(72) Inventors: Kazuyuki Mitsukura, Tokyo (JP); Masaya Toba, Tokyo (JP); Kenichi Iwashita, Tokyo (JP); Kohsuke Urashima, Tokyo (JP); Kazuhiko Kurafuchi, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 15/755,935

(22) PCT Filed: Feb. 9, 2016

(86) PCT No.: PCT/JP2016/053796
§ 371 (c)(1),
(2) Date: Feb. 27, 2018

(87) PCT Pub. No.: WO2017/038110
PCT Pub. Date: Mar. 9, 2017

(65) Prior Publication Data
US 2018/0337134 A1 Nov. 22, 2018

(30) Foreign Application Priority Data

Aug. 28, 2015 (JP) .................................. 2015-169782
Aug. 28, 2015 (JP) .................................. 2015-169783

(51) Int. Cl.
*H01L 23/00* (2006.01)
*H01L 23/538* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
None
See application file for complete search history.

(56) References Cited

U.S. PATENT DOCUMENTS

2006/0084253 A1* 4/2006 Mizukoshi .......... H01L 21/4846
438/584
2006/0220220 A1* 10/2006 Nakagawa .......... H01L 21/4846
257/700

(Continued)

FOREIGN PATENT DOCUMENTS

EP          2075825 A1 * 7/2009 ........ H01L 21/32115
JP          H7-170069 A   7/1995
(Continued)

OTHER PUBLICATIONS

Sakai, T. "A New Flip-Chip Bonding Method Using Ultra-Precision Cutting of Metal/Adhesive Layers" Jour. Of Japan Ins. Of Elec. Pack. 11(3) May 2008 pp. 217-222.*
(Continued)

*Primary Examiner* — Grant S Withers
(74) *Attorney, Agent, or Firm* — Fitch, Even, Tabin & Flannery, LLP

(57) ABSTRACT

To provide a manufacturing method capable of manufacturing a high density semiconductor device excellent in transmission between chips at a favorable yield and at low cost. A method for manufacturing a semiconductor device includes an insulating layer forming step of forming an insulating layer 3 having a trench 4 above a substrate 1, a copper layer forming step of forming a copper layer 5a on the insulating layer 3 so as to fill the trench 4, and a removing step of removing the copper layer 5a on the insulating layer 3 by a fly cutting method so as to retain a copper layer part in the trench 4.

19 Claims, 16 Drawing Sheets

(51) Int. Cl.
- *H01L 21/48* (2006.01)
- *H01L 21/56* (2006.01)
- *H01L 21/683* (2006.01)
- *H05K 3/46* (2006.01)
- *H01L 23/31* (2006.01)
- *H05K 1/18* (2006.01)

(52) U.S. Cl.
CPC ........ *H01L 21/4867* (2013.01); *H01L 21/561* (2013.01); *H01L 21/565* (2013.01); *H01L 21/568* (2013.01); *H01L 21/6835* (2013.01); *H01L 23/5383* (2013.01); *H01L 23/5386* (2013.01); *H01L 24/19* (2013.01); *H01L 24/20* (2013.01); *H05K 3/465* (2013.01); *H05K 3/4682* (2013.01); *H01L 23/3121* (2013.01); *H01L 23/5385* (2013.01); *H01L 2221/68372* (2013.01); *H01L 2221/68386* (2013.01); *H01L 2224/214* (2013.01); *H01L 2224/73204* (2013.01); *H05K 1/181* (2013.01)

(56) References Cited

U.S. PATENT DOCUMENTS

| | | | |
|---|---|---|---|
| 2007/0090546 A1* | 4/2007 | Shioga | H01L 21/4846 257/790 |
| 2007/0193026 A1* | 8/2007 | Dong | C23C 18/08 29/825 |
| 2008/0073110 A1* | 3/2008 | Shioga | H05K 1/162 174/258 |
| 2010/0276706 A1 | 11/2010 | Herrmann | |
| 2010/0327424 A1 | 12/2010 | Braunisch et al. | |
| 2011/0133341 A1 | 6/2011 | Shimizu et al. | |
| 2011/0221071 A1 | 9/2011 | Motohashi et al. | |
| 2013/0034934 A1* | 2/2013 | Meguro | H01L 23/525 438/113 |
| 2014/0008821 A1* | 1/2014 | Toyoda | H01L 24/97 257/792 |

FOREIGN PATENT DOCUMENTS

| | | |
|---|---|---|
| JP | H8-222834 A | 8/1996 |
| JP | 2003-204140 A | 7/2003 |
| JP | 2007-314866 A | 12/2007 |
| JP | 2010-532090 A | 9/2010 |
| JP | 2011-119502 A | 6/2011 |
| JP | 2012-060100 A | 3/2012 |
| JP | 2012-190858 A | 10/2012 |
| JP | 2012-227302 A | 11/2012 |
| JP | 2012-529770 A | 11/2012 |

OTHER PUBLICATIONS

Jinseong Kim et al., "Application of Through Mold Via (TMV) as PoP base package", 2008 58th Electronic Components and Technology Conference in IEEE, May 27, 2008.

Seung Wook Yoon et al., "Advanced low profile PoP solution with embedded wafer level PoP (eWLB-PoP) technology", 2012 IEEE 62nd Electronic Components and Technology Conference, May 29, 2012.

* cited by examiner

SEMICONDUCTOR DEVICE AND METHOD FOR MANUFACTURING SAME

CROSS-REFERENCE TO RELATED APPLICATIONS

This application is a U.S. national phase application filed under 35 U.S.C. § 371 of International Application No. PCT/JP2016/053796, filed Feb. 9, 2016, which claims priority from Japanese Patent Application No. 2015-169782, filed Aug. 28, 2015, designating the United States, and Japanese Patent Application No. 2015-169783, filed Aug. 28, 2015, designating the United States, which are hereby incorporated herein by reference in their entirety.

TECHNICAL FIELD

The present disclosure relates to a semiconductor device and a method for manufacturing the same. Specifically, the present disclosure relates to a method for manufacturing a semiconductor device efficiently and at low cost which is highly required to be micronized and heightened in density, and a semiconductor device manufactured by the manufacturing method.

BACKGROUND ART

There has been proposed an embodiment in which chips different in performance are mixedly mounted on one package for the purpose of higher density and higher performance of a semiconductor package. In this case, a cost advantageous technology for high density interconnect between the chips is important (e.g., see Patent Literature 1).

A package-on-package technology for connecting different packages which are stacked on a package by flip-chip mounting has been widely applied to a smartphone and a tablet terminal (e.g., see non-Patent Literature 1 and non-Patent Literature 2).

Further, there has been proposed, as another form of mounting a plurality of chips at higher density, a packaging technology using an organic substrate having a high density wiring (organic interposer), a fan-out packaging technology (FO-WLP) having a through mold via (TMV), a packaging technology using a silicon interposer or a grass interposer, a packaging technology using a through-silicon via (TSV), a packaging technology using a chip embedded in a substrate for inter-chip transmission, or the like.

Particularly, in the organic interposer and the FO-WLP, in a case where the semiconductor chips are mounted in parallel with each other, a micro wiring layer is required in order to make the semiconductor chips electrically conduct with each other at a high density (e.g., see Patent Literature 2).

CITATION LIST

Patent Literature

Patent Literature 1: Japanese Unexamined Patent Publication No. 2012-529770
Patent Literature 2: US Patent Application Publication No. 2011/0221071

Non Patent Literature

Non Patent Literature 1: Application of Through Mold Via (TMV) as PoP Base Package, Electronic Components and Technology Conference (ECTC), 2008
Non Patent Literature 2: Advanced Low Profile PoP Solution with Embedded Wafer Level PoP (eWLB-PoP) Technology, ECTC, 2012

SUMMARY OF INVENTION

Technical Problem

For forming the micro wiring, processes are ordinarily needed such as forming a seed layer by sputtering, forming a resist, electroplating, removing a resist, and removing an unnecessary seed layer, involving a process cost problem. Therefore, in forming the micro wiring, cost reduction by simplifying the above processes has been highly demanded.

The present disclosure has an object to provide a high density semiconductor device which can be manufactured at a favorable yield and at low cost and is excellent in transmission between chips, and a method for manufacturing the same.

Solution to Problem

The present inventors have studied in order to solve the above problems to consequently find a manufacturing method having an excellent feature.

A first aspect of an embodiment of the present disclosure is a method for manufacturing a semiconductor device, including an insulating layer forming step of an insulating layer having a trench above a substrate, a copper layer forming step of forming a copper layer on the insulating layer so as to fill the trench, and a removing step of removing the copper layer on the insulating layer by a fly cutting method so as to retain a copper layer part in the trench.

According to the first aspect of the embodiment, because chemical mechanical polish (CMP) is not needed when forming the wiring (the copper layer part in the trench), a yield can be improved as compared with a process of related art, and dishing of the wiring (copper) does not occur, high density wiring forming is enabled, and a manufacturing cost can be significantly reduced.

A second aspect of the embodiment is a semiconductor device having a semiconductor element mounted on a wiring body provided on a substrate, in which the wiring body has wiring layers stacked on each other, each of wiring layers is provided with an insulating layer having a trench on a side of one surface of the wiring layer, and a copper wiring formed so as to fill the trench, and a surface roughness of each of the insulating layer and the copper wiring on the side of one surface of the wiring layer is 0.03 µm or more and 0.1 µm or less.

According to the second aspect of the embodiment, a surface roughness of each of the insulating layer and the copper wiring on the side of one surface of each wiring layer is 0.03 µm or more and 0.1 µm or less. This surface roughness has a value larger than a surface roughness in a case where the insulating layer and the copper wiring are exposed by the CMP. For this reason, when manufacturing the above semiconductor device, since the CMP may not be used in forming the copper wiring in the trench, a yield can be improved as compared with a process of related art and dishing of the wiring does not occur, and therefore, high density wiring forming is enabled, and a manufacturing cost can be significantly reduced. In addition, since each of the insulating layer and the copper wiring on the side of one surface of each of a plurality of wiring layers has the above surface roughness, adhesion between the wiring layers connecting with each other via the side of one surface can be improved. This can suppress peeling off of the wiring layer.

Advantageous Effects of Invention

According to embodiments of the present disclosure, it is possible to provide a high density semiconductor device excellent in transmission between chips at a favorable yield and at low cost.

DESCRIPTION OF EMBODIMENTS

Hereinafter, embodiments are described with reference to the drawings. In the following description, the same or equivalent parts are designated by the same reference signs, and the duplicated description is omitted. Additionally, a positional relationship such as up, down, left and right is based on a positional relationship shown in the figure unless otherwise specifically described. Further, a scale of dimensions of the drawings is not necessarily limited to a scale shown in the figure.

In a case that terms "left", "right", "front side", "rear side", "over", "under", "upward", "downward", "first", "second" and the like are used in the description and the claims, these are intended to provide explanation, and not necessarily mean a permanent relative positional relationship. The term "layer" encompasses a structure of a shape thereof formed all over a surface seen as a plan view and also a structure of a shape thereof partially formed. The term "step" includes not only an independent step but also those attaining intended purposes thereof even if they cannot be distinctively distinguished from other steps. A numerical range expressed with the sign "-" (or "to") represents a range including numerical values before and after "-" as the minimum value and the maximum value, respectively. In a numerical range herein described in a stepwise manner, an upper or lower limit value of a numerical range in a level may be replaced with an upper or lower limit value of a numerical range in another level.

Figure 6:
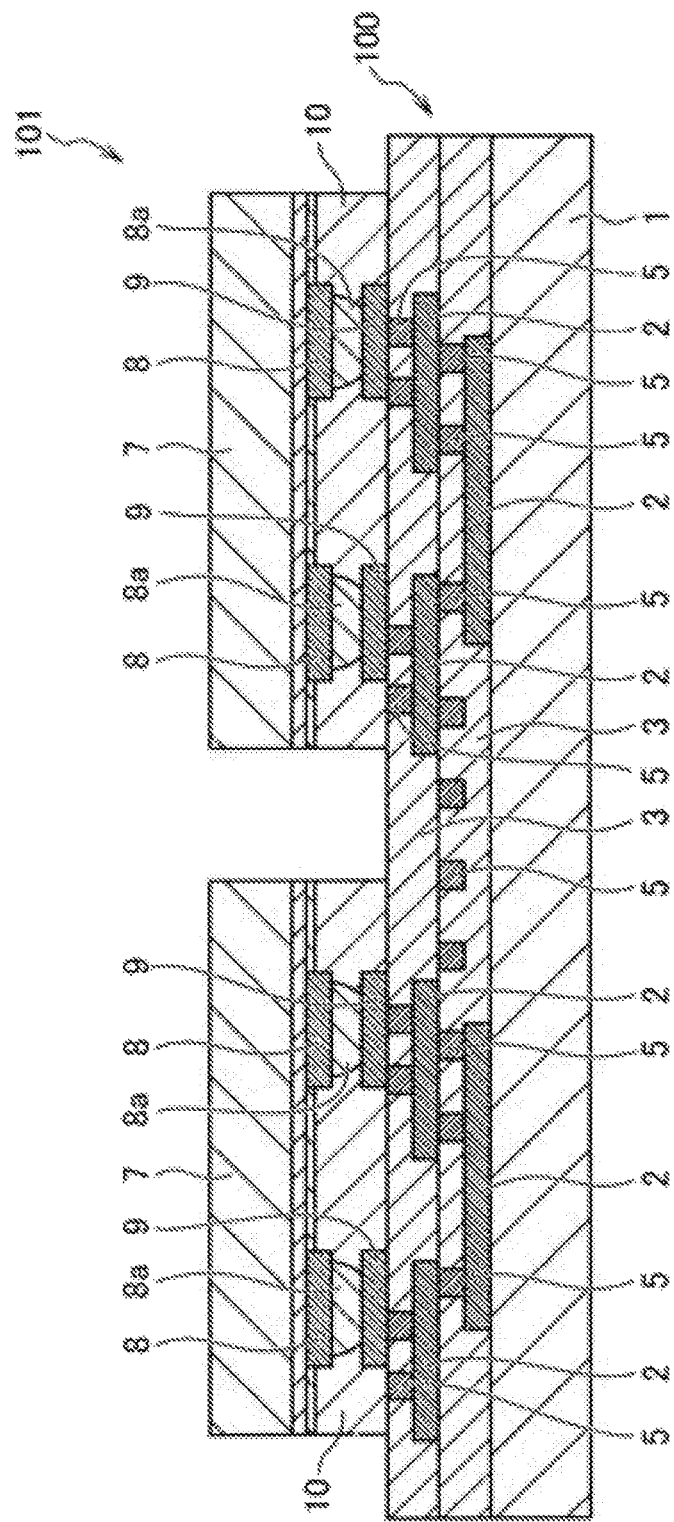
FIG. 6 is a sectional view schematically illustrating a state of mounting a semiconductor element on a high density wiring layer with an underfill material.
Figure 16:
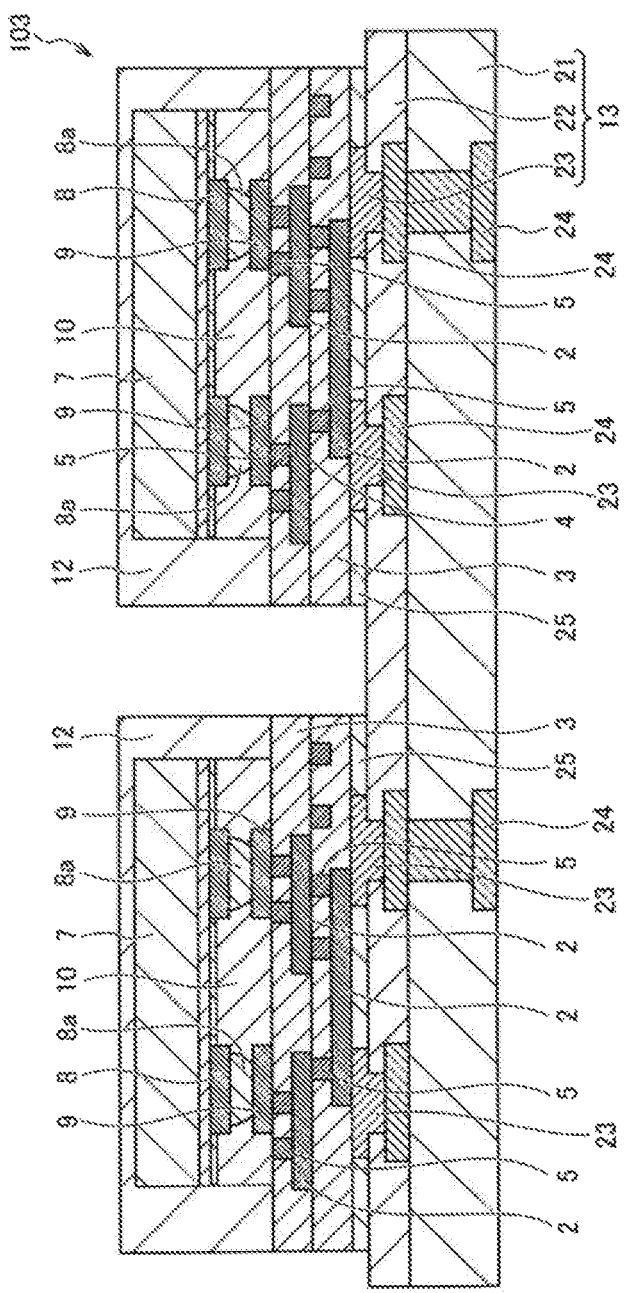
FIG. 16 is a sectional view schematically illustrating a state of mounting the sealed semiconductor element with a wiring layer on a substrate.

A description is given of a method for manufacturing a semiconductor package (semiconductor device) 101 shown in FIG. 6 and a semiconductor package (semiconductor device) 103 shown in FIG. 16 according to an embodiment of the present disclosure. Note that a method for manufacturing a semiconductor device according to the present disclosure is particularly preferable in a mode where micronization and higher pin count are required. In particular, the manufacturing method according to the present disclosure is used in a mode of packaging where an interposer is required for mixedly mounting different kinds of chips.

With reference to FIG. 1 to FIG. 6, a method for manufacturing the semiconductor package 101 is described.

Figure 1:
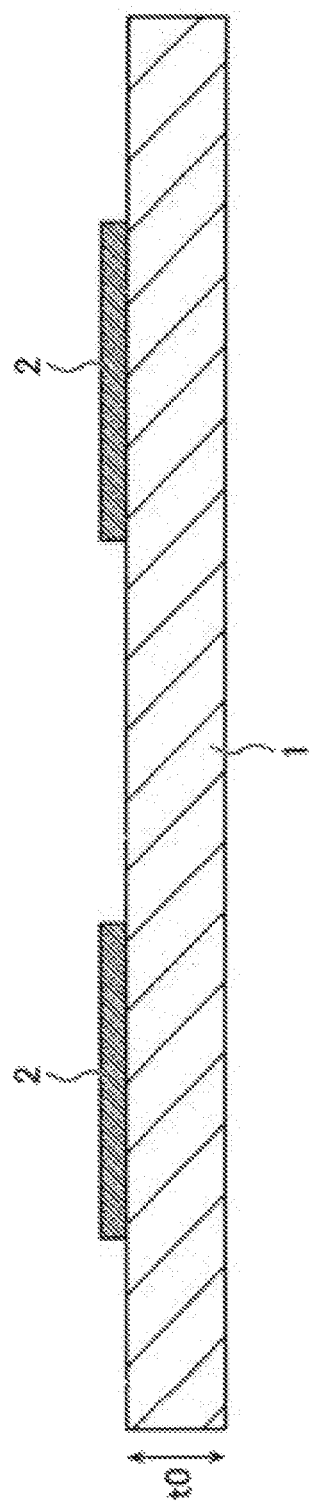
FIG. 1 is a sectional view schematically illustrating a state of forming a first copper wiring on a substrate.

As shown in FIG. 1, first, a first copper wiring 2 is formed on a substrate 1 (a copper wiring forming step). This forms the first copper wiring 2 patterned on a part of an upper surface of the substrate 1.

The substrate 1 is not specifically limited, but is a substrate including a silicon plate, a glass plate, an SUS plate, and a glass cloth (e.g., prepreg, etc.), or a substrate made of resin and the like sealing in a semiconductor element. The substrate 1 may be a substrate having a storage elastic modulus of 1 GPa or more at 25° C.

A thickness t0 of the substrate 1 is 0.2 to 2.0 mm, for example. If the thickness t0 is 0.2 mm or more, handling of the substrate 1 is favorable. If the thickness t0 is 2.0 mm or less, a material cost of the substrate 1 is likely to be able to be kept low.

The substrate 1 may be wafer-shaped or panel-shaped. A size of the substrate 1 in a planar view is not specifically limited. If the substrate 1 is wafer-shaped, a diameter of the substrate 1 is 200 mm, 300 mm, or 450 mm, for example. If the substrate 1 is panel-shaped, the substrate 1 is a rectangular panel having a side of 300 to 700 mm, for example.

The first copper wiring 2 can be formed by an inkjet method, a screen printing method, or a spray coating method, for example. For example, the first copper wiring 2 can be formed on the substrate 1 by applying a copper paste on the substrate 1 using a printing device. The first copper wiring 2 can be formed also by copper foil laminating, sputtering, or plating to form a copper layer, and etching appropriate portions via a resist pattern. Forming the first copper wiring 2 by use of the copper paste eliminates the need for a seed layer for wiring forming, and allows a resist forming step and a resist removing step to be omitted also. For this reason, a manufacturing cost can be considerably reduced as compared with a process of related art forming the seed layer.

The copper paste is a material in which copper particles are dispersed in a solvent. The solvent that the copper particles are dispersed is not specifically limited, but a solvent containing a compound having an alcohol group, an ester group, an amino group, or the like.

An average particle diameter of the copper particle is not specifically limited, but is 10 to 500 nm, for example. From a view point of dispersibility, it is preferable that the average particle diameter of the copper particle be 20 to 300 nm. From a view point of sinterability, it is more preferable that the average particle diameter of the copper particle be 50 to 200 nm. The average particle diameter of the copper particle herein refers to an arithmetic mean value of measured lengths of long axes of 200 copper particles selected at random. Note that a length of the long axis of the copper particle can be measured by a scanning electron microscope, for example.

A viscosity of the copper paste can be selected depending on its usage. For example, in a case where the screen printing method is used to apply the copper paste to the substrate 1, a viscosity of the copper paste may be 0.1 to 30 Pa·s. In a case where the inkjet printing method or the spray coating method is used, the viscosity of the copper paste may be 0.1 to 30 mPa·s.

Figure 2:
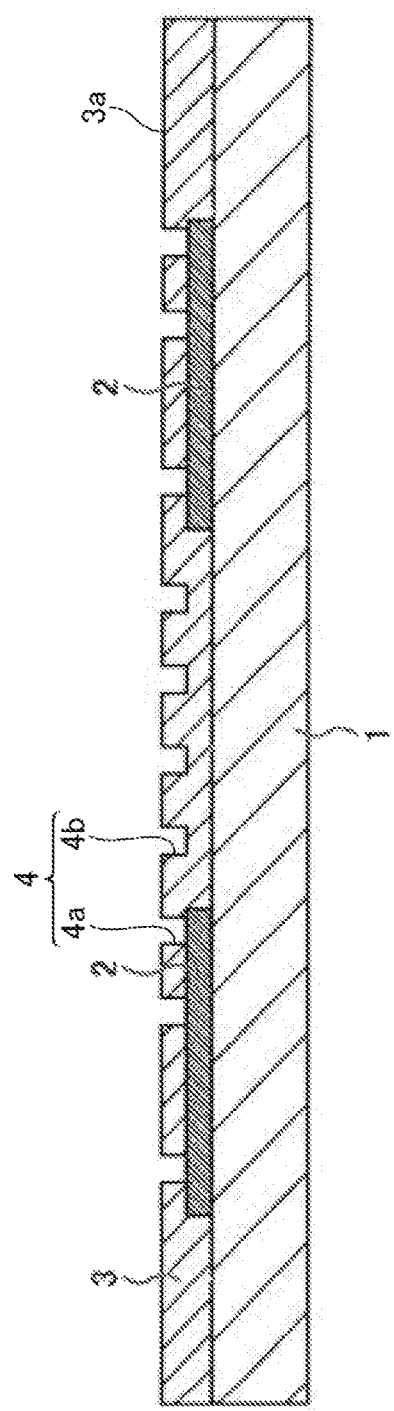
FIG. 2 is a sectional view schematically illustrating a state of forming a trench on an insulating layer.

Next, as shown in FIG. 2, an insulating layer 3 covering the first copper wiring 2 is formed on the substrate 1 (insulating layer forming step).

The insulating layer 3 is formed of a liquid or film-shaped insulating material, for example. From a view point of film thickness flatness and the cost, it is preferable to use the film-shaped insulating material. In the insulating layer 3, a filler may be contained. An average particle diameter of this filler is 500 nm or less, for example, from a view point of forming a micronized trench 4. Filler content relative to a total amount of the insulating material may be less than 1 mass %, for example. Note that the filler may not be contained in the insulating layer 3.

In a case where the above film-shaped insulating material is used to form the insulating layer 3, the insulating material is attached on the substrate 1 on which the first copper wiring 2 is formed by a laminating step, for example. The laminating step is performed at a temperature set at 40 to 120° C., for example. For this reason, it is preferable to use, as the film-shaped insulating material, a photosensitive insulative film capable of being laminated at 40 to 120° C. Setting 40° C. or more to the temperature at which lamination is capable makes it possible to suppress increase in a tackiness of the photosensitive insulative film at a room temperature, and maintain favorable handling property of the photosensitive insulative film. Setting 120° C. or less to the temperature at which the photosensitive insulative film can be laminated makes it possible to prevent occurrence of the photosensitive insulative film warpage after the laminating step. Note that the "room temperature" refers to around 25° C.

A thickness of the insulating layer 3 is 10 μm or less from a view point of forming a micronized trench 4 described later, for example. It is preferable that the thickness of the insulating layer 3 be 5 μm or less, more preferably, 3 μm or less. Moreover, the thickness of the insulating layer 3 is 1 μm or more, for example, from a view point of electrical reliability.

A thermal expansion coefficient after curing the insulating layer 3 is 80 ppm/° C. or less, for example, from a view point of preventing the insulating layer 3 from warping. It is preferable that the thermal expansion coefficient be 70 ppm/° C. or less from a view point of preventing peeling off or cracking in a temperature cycling test and a reflow step. It is also preferable that the thermal expansion coefficient be 20 ppm/° C. or more from a view point of improving a stress relaxation characteristic of the insulating layer 3 and facilitating forming of a micronized trench 4.

After forming the insulating layer 3, a trench 4 is formed on the insulating layer 3 (trench forming step). Both sidewalls of the trench 4 are formed by the insulating layer 3. A part of an upper surface of the first copper wiring 2 is exposed between both sidewalls of some trenches 4. The trench 4 has a line width of 0.5 to 5 μm, for example.

Specifically, in the trench forming step, as the trenches 4 having a substantially rectangular section, a plurality of first trenches 4a formed to overlap the first copper wiring 2, and a plurality of second trenches 4b formed not to overlap the first copper wiring 2 are formed. The first trench 4a is provided so as to expose the upper surface of the first copper wiring 2. For this reason, both side surfaces (both sidewalls) of the first trench 4a are configured by the insulating layer 3, and a bottom surface of the first trench 4a is configured by the first copper wiring 2. Therefore, in a state after completing the trench forming step, a part of the upper surface of the first copper wiring 2 is exposed between both sidewalls of the first trench 4a. On the other hand, both side surfaces (both sidewalls) and bottom surface of the second trench 4b are configured by the insulating layer 3. Note that at least a part of a bottom surface of the first trench 4a may be configured by the first copper wiring 2, and a part of the bottom surface of the first trench 4a may be configured by the insulating layer 3.

Examples of a method for forming the trench 4 include laser ablation, photolithography, or imprint. From a view point of micronization of the trench 4 and cost, the photolithography performing exposure and development is preferable. In a case of the photolithography, it is preferable to use, as the insulating layer 3, a film-shaped photosensitive resin material (photosensitive insulative film) having an insulation property.

If the insulating layer 3 is a photosensitive insulative film, the trench 4 can be formed by directly exposing and developing the insulating layer 3 without using a resist mask. In this case, the resist forming step and the resist removing step can be omitted, achieving simplification of the steps. Note that the photosensitive resin material may be a negative type or a positive type.

Examples of a method for exposing the photosensitive resin material in the above photolithography may include a known projection exposure scheme, a contact exposure scheme, or a direct exposure scheme. In order to develop the photosensitive resin material, alkaline aqueous solution of sodium carbonate, TMAH or the like may be used, for example.

In the trench forming step, the insulating layer 3 may be further heated to be cured after forming the trench 4. For example, the insulating layer 3 is heated to be cured with a heating temperature being set in 100 to 200° C. and a heating time being set in 30 min to 3 hours.

Figure 3:
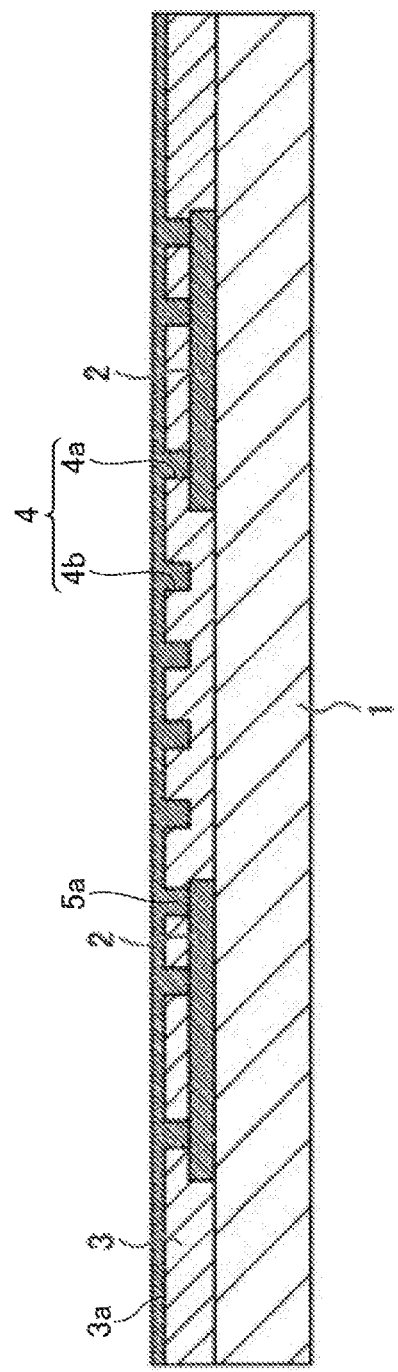
FIG. 3 is a sectional view schematically illustrating a state of sintering a copper paste after being applied to the trench to form a copper layer.

Next, as shown in FIG. 3, a copper layer 5a is formed to cover the trench 4 (copper layer forming step).

Specifically, the copper paste is applied on the insulating layer 3 by applying the copper paste to the upper surface of the insulating layer 3 to fill the trench 4 (the first trench 4a and the second trench 4b), for example (applying step). Then, the applied copper paste is subjected to a sintering process to obtain the sintering processed copper layer 5a (sintering step). The copper layer 5a (especially, a copper layer part in the trench 4) is electrically connected with the first copper wiring 2 exposed in the trench 4. Here, the copper layer 5a obtained by sintering the copper paste is considered to be different in density and the like from copper obtained by sputtering, plating or the like of related art. Therefore, both of them can be determined on the basis of their sectional views, for example. Forming the copper layer 5a by use of the copper paste eliminates the need for a seed layer for forming a second copper wiring 5 described below, and allows the resist forming step and the resist removing step to be omitted also. For this reason, a manufacturing cost can be considerably reduced as compared with a process of related art forming the seed layer.

Examples of a method for applying the copper paste include an inkjet method, a printing method, a spin coating method, a spray coating method or the like.

Examples of a method for sintering the copper paste include sintering by heating, or light sintering by xenon flash. In a case where the copper paste is sintered by heating, the copper paste sintering step is performed in a nitrogen atmosphere, in a presence of hydrogen, or in a presence of acid, for example. It is preferable to perform the sintering step in a presence of acid from a view point of obtaining the copper layer dense and low in a volume resistivity value. The presence of acid means that vaporized acid exists within a gas. Formic acid, acetic acid, and the like can be used as acid, and it is preferable to use formic acid. It is more preferable to perform the sintering step in an atmosphere of nitrogen and formic acid being mixed from a view point of obtaining the copper layer dense and low in a volume resistivity value in a shorter time. Formic acid content in nitrogen is 0.005 to 10 volume %, for example. It is preferable that formic acid content in nitrogen be 0.01 to 5 volume % from a view point of obtaining a homogeneous copper layer.

A sintering temperature for the copper paste is set in 80 to 200° C. from a view point of sintering in a short time and suppressing thermal denaturation of the insulating layer, for example. It is preferable to set the sintering temperature in 120 to 200° C. from a view point of lowering the volume resistivity value. It is more preferable to set the sintering temperature in 120 to 180° C. from a view point of obtaining a denser copper layer.

A volume resistivity of the sintered copper layer is 40 μΩ·cm or less, for example, from a view point of a transmission efficiency. It is preferable that the volume resistivity be 30 μΩ·cm or less from a view point of suppressing a heating value. It is more preferable that the volume resistivity be 20 μΩ·cm or less from a view point of reliability. Note that the volume resistivity is typically 3 μΩ·cm or more.

Figure 4:
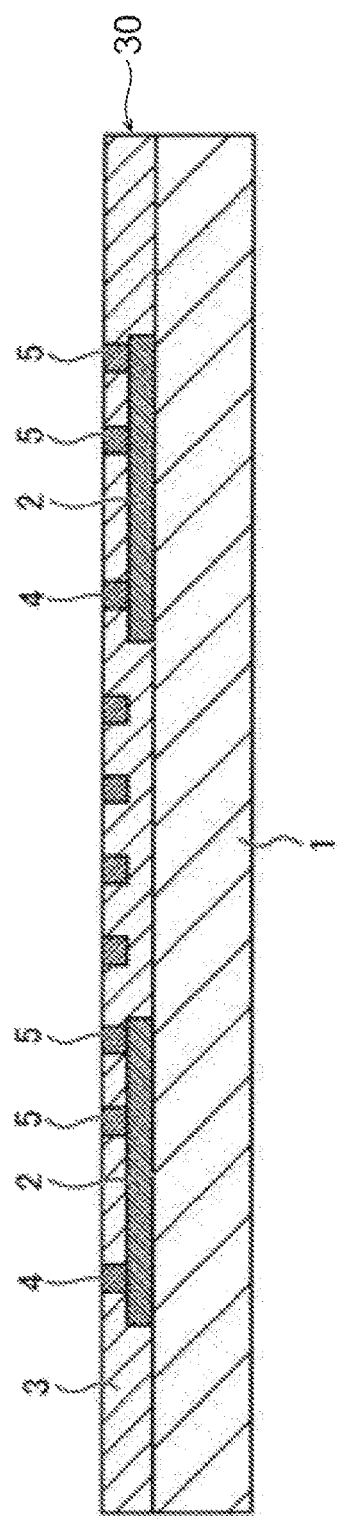
FIG. 4 is a sectional view schematically illustrating a state of removing the copper layer over the insulating layer to form a second copper wiring.

Next, as shown in FIG. 4, the copper layer 5a over the insulating layer 3 is removed by a fly cutting method (removing step). This exposes the copper layer part filled in the trench 4 so that a wiring layer 30 is formed, the wiring layer 30 having the first copper wiring 2, the insulating layer 3, and the copper layer part filled on the insulating layer 3.

Specifically, the copper layer 5a on the insulating layer 3 is removed by the fly cutting method so as to retain the copper layer part in the trench 4. This exposes the copper layer part applied and sintered in the trench 4 provided on the insulating layer 3.

Note that the copper layer part in the first trench 4a of the trench 4 can be also said to be the second copper wiring 5 electrically connected with the first copper wiring 2. That is, in the above removing step, a part of the copper layer 5a is removed to form the second copper wiring 5. As shown in FIG. 3, the copper layer 5a is formed on all over the surfaces of the insulating layer 3 and trench 4. In other words, the copper layer 5a is formed also on other region than a region (trench 4) where the second copper wiring 5 is to be formed. For this reason, the above removing step can be said to be a step of removing the copper layer part of the copper layer 5a formed on a region except for that in the trench 4.

The fly cutting method uses a grinding device with a diamond bite, for example. Specific examples of the device include an automatic surface planer supporting a 300 mm wafer (from DISCO Corporation, trade name "DAS8930"). Note that the removal of the copper layer 5a by the fly cutting method described above can be said to be a planarizing process. The above removing step may be combined with etching or the like in addition to the fly cutting method.

When removing the copper layer 5a on the insulating layer 3 with the copper layer part in the trench 4 being left by grinding using the fly cutting method, the copper layer 5a including a part of the insulating layer 3 may be removed. A part of the insulating layer 3 refers to the upper surface of the insulating layer 3 and a region in the vicinity of the upper surface. A thickness of the region in the vicinity of the upper surface of the insulating layer 3 is set within 10% of the thickness of the insulating layer 3 itself, for example. In this way, removing a part of the insulating layer 3 allows contamination by copper to be reduced to improve the reliability. Note that a part of the second copper wiring 5 in the trench 4 is also removed at the same time as when a part of the insulating layer 3 is removed.

A surface roughness (arithmetic mean roughness (Ra) defined in JIS B 0601 2001) of each of the insulating layer 3 and the second copper wiring 5, constituting a surface opposite to the substrate 1, in the wiring layer 30 grinded by the fly cutting method is 0.03 μm or more and 0.1 μm or less, for example. In order to make the surface roughness of these be 0.03 μm or more and 0.1 μm or less, it is preferable to use a surface planer to physically grind the second copper wiring 5, the insulating layer 3, and the copper layer 5a on the insulating layer 3. Examples of the surface planer include an automatic surface planer (from DISCO Corporation, trade name "DAS8930"), for example. For example, the grinding by the fly cutting method is performed under a condition at a feed speed of 1 mm/s and a spindle revolution speed of 2000 rpm. The surface roughness of each of the insulating layer 3 and the second copper wiring 5 after grinding is measured by scanning a range of 100 μm×100 μm including the insulating layer 3 and the second copper wiring 5 using a laser microscope ("LEXT OLS3000" from OLYMPUS Corporation), for example. Note that if the copper layer 5a is removed by CMP, for example, to expose the insulating layer 3 and the second copper wiring 5, the surface roughness of each of the insulating layer 3 and the second copper wiring 5 is 20 nm or less (0.02 μm or less).

Figure 5:
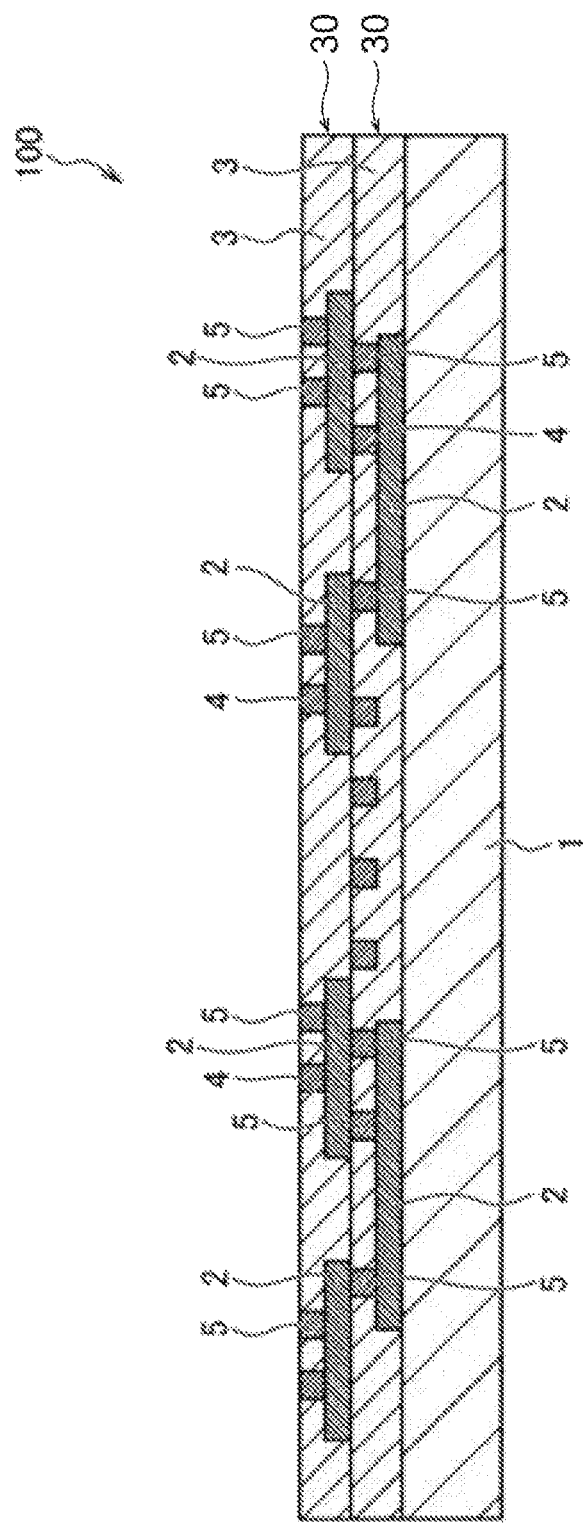
FIG. 5 is a sectional view schematically illustrating a state of forming other first copper wiring, other insulating layer, and other second copper wiring.

Next, as shown in FIG. 5, the above copper wiring forming step, the above insulating layer forming step, the above trench forming step, the above copper layer forming step, and the above removing step are repeated to form a high density wiring layer (wiring body) 100 in which a plurality of wiring layers 30 are stacked on the substrate 1. Note that surfaces of a plurality of respective wiring layers 30 opposite to the substrate 1 are grinded by the fly cutting method. Therefore, surface roughness of each of the surfaces of a plurality of wiring layers 30 opposite to the substrate 1 is 0.03 μm or more and 0.1 μm or less.

Specifically, as shown in FIG. 5, after forming the second copper wiring 5, other first copper wiring 2 is formed on the insulating layer 3 and the second copper wiring 5. Here, that other first copper wiring 2 is formed to electrically connect with the second copper wiring 5. Next, other insulating layer 3 having other trench 4 is formed to cover that other first copper wiring 2. That other trench 4 may be provided to overlap the trench 4, or may be provided not to overlap the trench 4. Next, similar to the above copper layer forming step and the above removing step, other second copper wiring 5 is formed. That other second copper wiring 5 is provided to electrically connect with the first copper wiring 2 via that other first copper wiring 2 and the second copper wiring 5.

Next, as shown in FIG. 6, a semiconductor element 7 is mounted on the resulted high density wiring layer 100 with an underfill material 10 to form the semiconductor package 101.

In mounting the semiconductor element 7 on the high density wiring layer 100, first, an electrode 9 is formed on the high density wiring layer 100 before mounting the semiconductor element 7 on the high density wiring layer 100. The electrode 9 of the high density wiring layer 100 is formed using the same method as in the copper wiring forming step describe above, for example.

The electrode 9 is provided to electrically connect with the other second copper wiring 5 which is exposed on the high density wiring layer 100. In the case that the electrode 9 is formed using the same method as in the above copper wiring forming step, the electrode 9 is constituted by copper.

Next, an electrode 8 of the semiconductor element 7 is metallically connected with the electrode 9 of the high density wiring layer 100. Examples of a method for metallically connecting the electrode 8 with the electrode 9 include a method in which a solder 8a is formed between the electrode 8 and the electrode 9 to metallically connect the electrode 8 with the electrode 9 by the solder 8a joint. At this time, the electrode 8 may be metallically connected with the electrode 9 through the solder 8a by thermal compression bonding. The solder 8a is in a shape of a ball, for example. The solder 8a may be formed by plating or a printing method, for example.

Examples of the underfill material 10 for fixing the semiconductor element 7 on the high density wiring layer 100 include a capillary underfill (CUF), a mold underfill (MUF), a paste underfill (NCP), a film underfill (NCF), or a photosensitive underfill.

Examples of the semiconductor element 7 include, without specific limitation, a graphics processing unit (GPU), a volatile memory such as a DRAM or an SRAM, a non-volatile memory such as a flash memory, an RF chip, a silicon photonics chip, a MEMS, a sensor chip and the like. A semiconductor element having a TSV can be also used.

The semiconductor element 7 in which the semiconductor elements are stacked can be used. For example, the semiconductor element 7 in which the semiconductor elements are stacked using the TSV can be used. A thickness of the semiconductor element 7 is 200 μm or less, for example. It is preferable that the thickness of the semiconductor element 7 be 100 μm or less from a view point of making the semiconductor package 101 thinner. The thickness of the semiconductor element 7 may be 30 μm or more, for example, from a view point of handling property of the semiconductor package 101.

Hereinafter, a description is given of a method for manufacturing a semiconductor package 103 with reference to FIG. 7 to FIG. 16.

Figure 7:
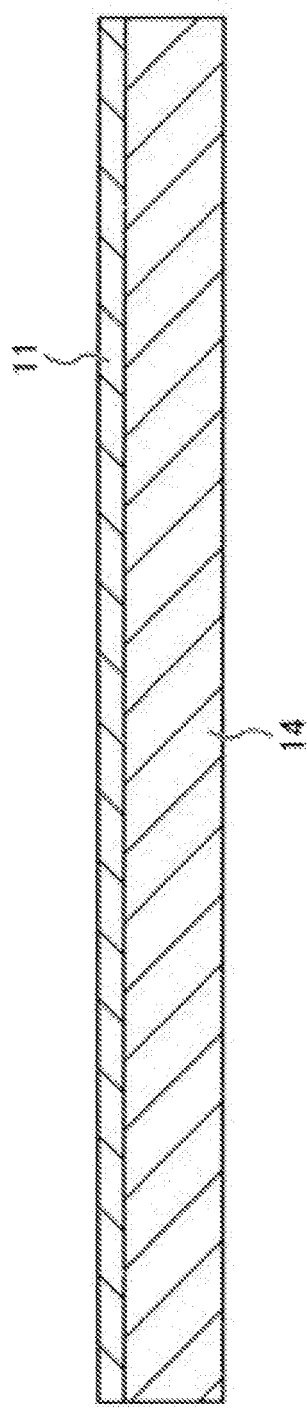
FIG. 7 is a sectional view schematically illustrating a state of forming a temporary fixing layer on a carrier.

As shown in FIG. 7, first, a temporary fixing layer 11 is formed on a carrier 14 that is a temporary substrate (temporary fixing layer forming step).

A method for forming the temporary fixing layer 11 is not specifically limited, but spin coating, spray coating, or laminating may be included, for example. The temporary fixing layer 11 has, for example, a resin containing a non-polar component such as polyimide, polybenzoxazole, silicon, and fluorine, a resin containing a component being capable of expanding in volume or foaming by being heated or UV-irradiated (ultraviolet-irradiated), a resin containing a component being capable of progressing in cross-linking reaction by being heated or UV-irradiated, or a resin being capable of generating heat by being light-irradiated.

It is preferable that the temporary fixing layer 11 have a property tending to be peeled off by receiving an external stimulus such as the light or heat, from a view point of capability of highly achieving both the handling property and ease of peeling from the carrier 14. It is more preferable that the temporary fixing layer 11 contain particles being capable of expanding in volume through a heating process, from a view point that the temporary fixing layer 11 can be easily peeled off with no temporary fixing layer 11 remaining on the semiconductor device described later. In the case that a material containing a component (foaming agent) being capable of expanding in volume or foaming by being heated is used for the temporary fixing layer 11, it is preferable that the foaming agent rapidly foam or expand in volume at 200° C. or more, from a view point of a curing temperature and sintering temperature of an insulating material 12 described later.

Figure 8:
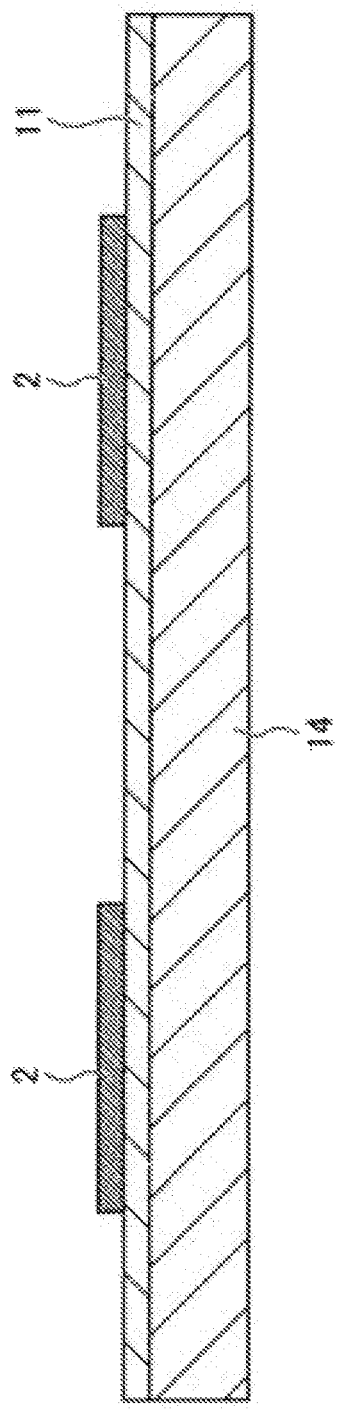
FIG. 8 is a sectional view schematically illustrating a state of forming a first copper wiring.

Next, as shown in FIG. 8, the first copper wiring 2 is formed on the temporary fixing layer 11 (copper wiring forming step).

The first copper wiring 2 may be a connection electrode part which is connected later with an electrode provided to another substrate.

Figure 9:
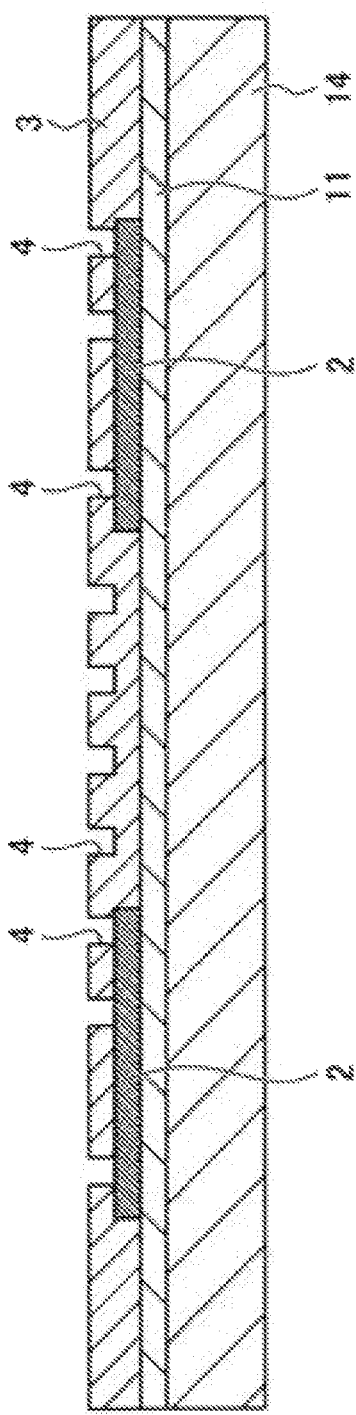
FIG. 9 is a sectional view schematically illustrating a state of forming a trench on an insulating layer.

Next, as shown in FIG. 9, the insulating layer 3 covering the first copper wiring 2 is formed on the temporary fixing layer 11 (insulating layer forming step).

Then, the trench 4 is formed on the insulating layer 3 (trench forming step).

Figure 10:
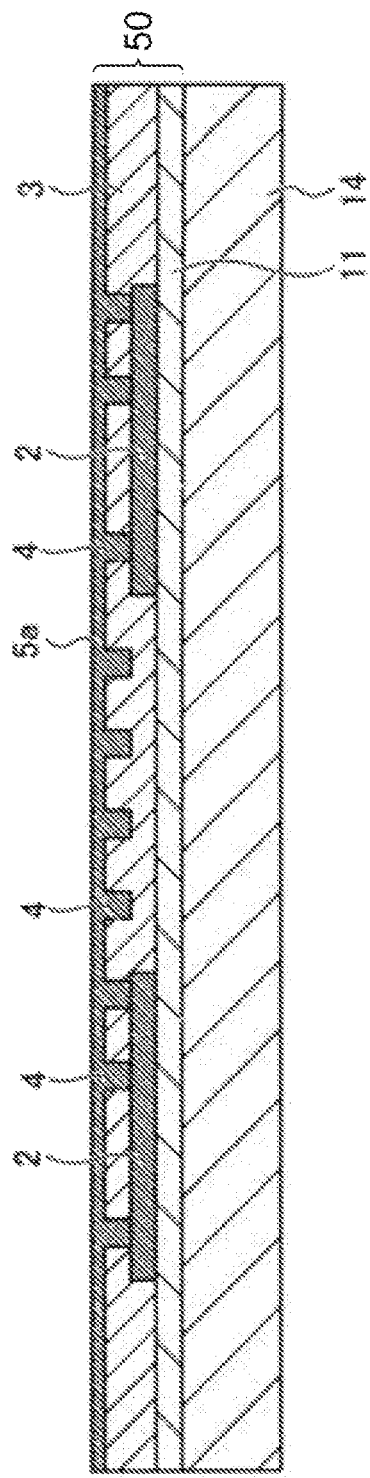
FIG. 10 is a sectional view schematically illustrating a state of sintering a copper paste after being applied to the trench to form a first copper layer.

Next, as shown in FIG. 10, the copper paste is applied to the trench 4. Specifically, the copper paste is applied on the insulating layer 3 by applying the copper paste to the upper surface of the insulating layer 3 to fill the trench 4 (applying step). Then, the applied copper paste is subjected to the sintering process to obtain the sintering processed copper layer 5a (sintering step). Here, a laminated body 50 is obtained which includes the insulating layer 3 having the trench 4 and the copper layer 5a that is a sintered body of the copper paste formed in the trench 4, and has the temporary fixing layer 11 as an under layer of the insulating layer 3.

Figure 11:
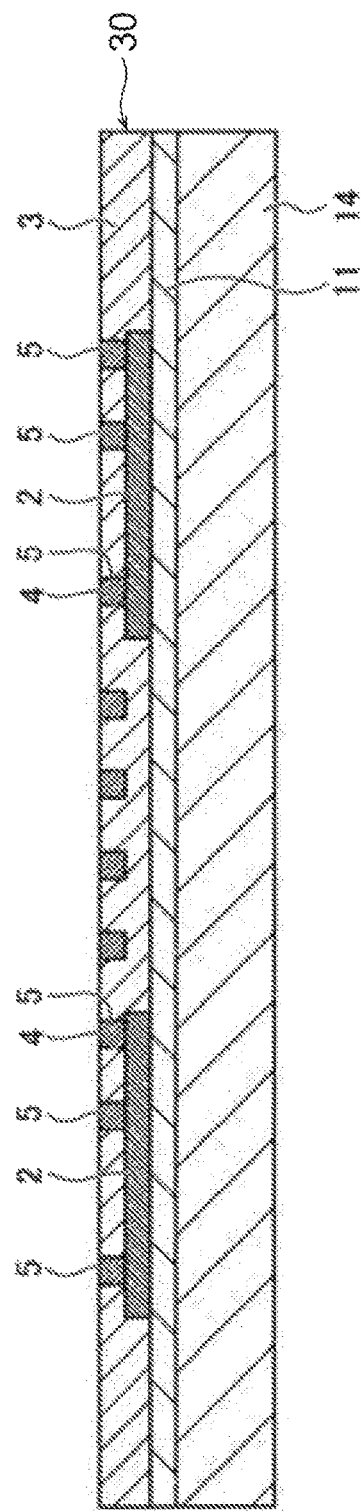
FIG. 11 is a sectional view schematically illustrating a state of removing the first copper layer over the insulating layer.

Next, as shown in FIG. 11, the copper layer 5a over the insulating layer 3 is removed (removing step).

In the removing step, the fly cutting method is used, for example, to remove the copper layer 5a on the insulating layer 3 with the copper layer part in the trench 4 being left.

Figure 12:
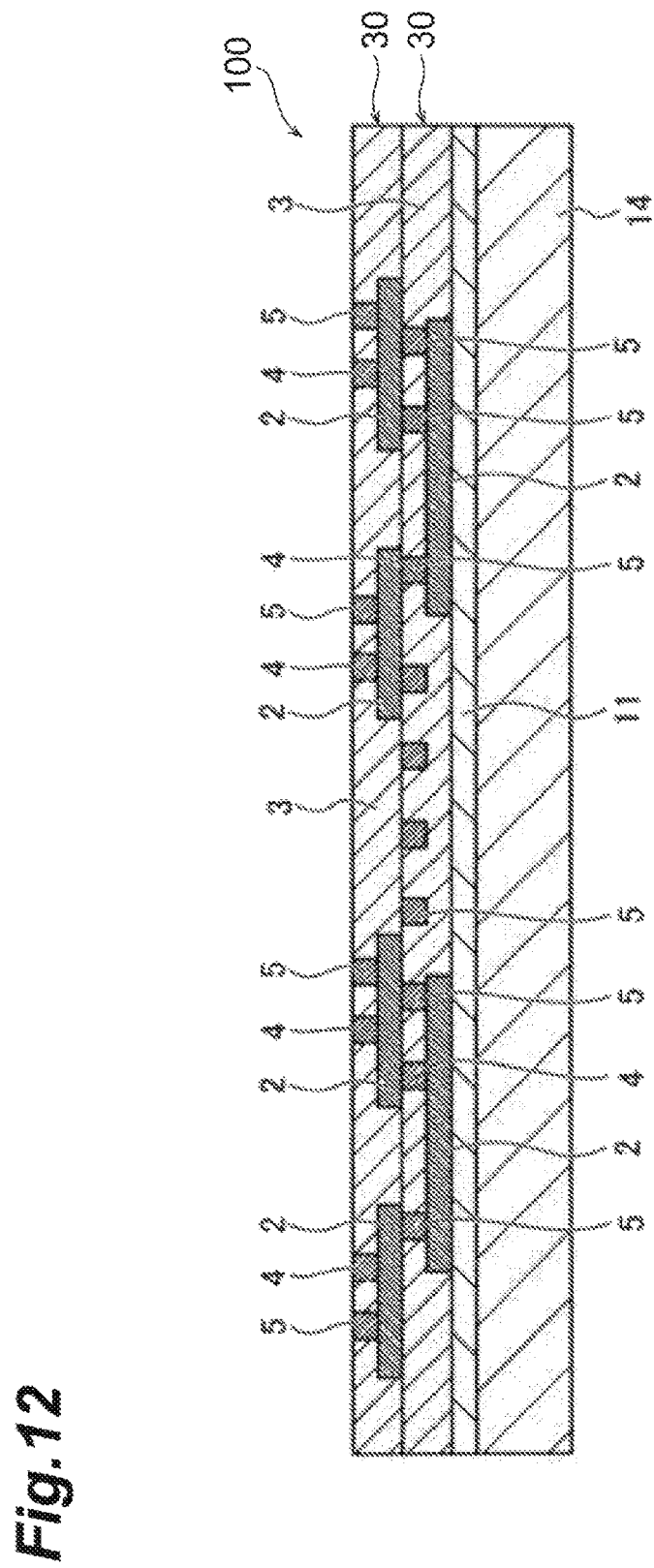
FIG. 12 is a sectional view schematically illustrating a state of forming other first copper wiring, other insulating layer, and other second copper wiring.

Next, as shown in FIG. 12, the above copper wiring forming step, the above insulating layer forming step, the above trench forming step, the above applying step, the above sintering step, and the above removing step are repeated to form the high density wiring layer 100 on the temporary fixing layer 11.

In FIG. 12, similar to FIG. 5, other first copper wiring 2, other insulating layer 3, and other second copper wiring 5 are formed in this order on the insulating layer 3 and the second copper wiring 5 to form the high density wiring layer 100 on the temporary fixing layer 11.

Figure 13:
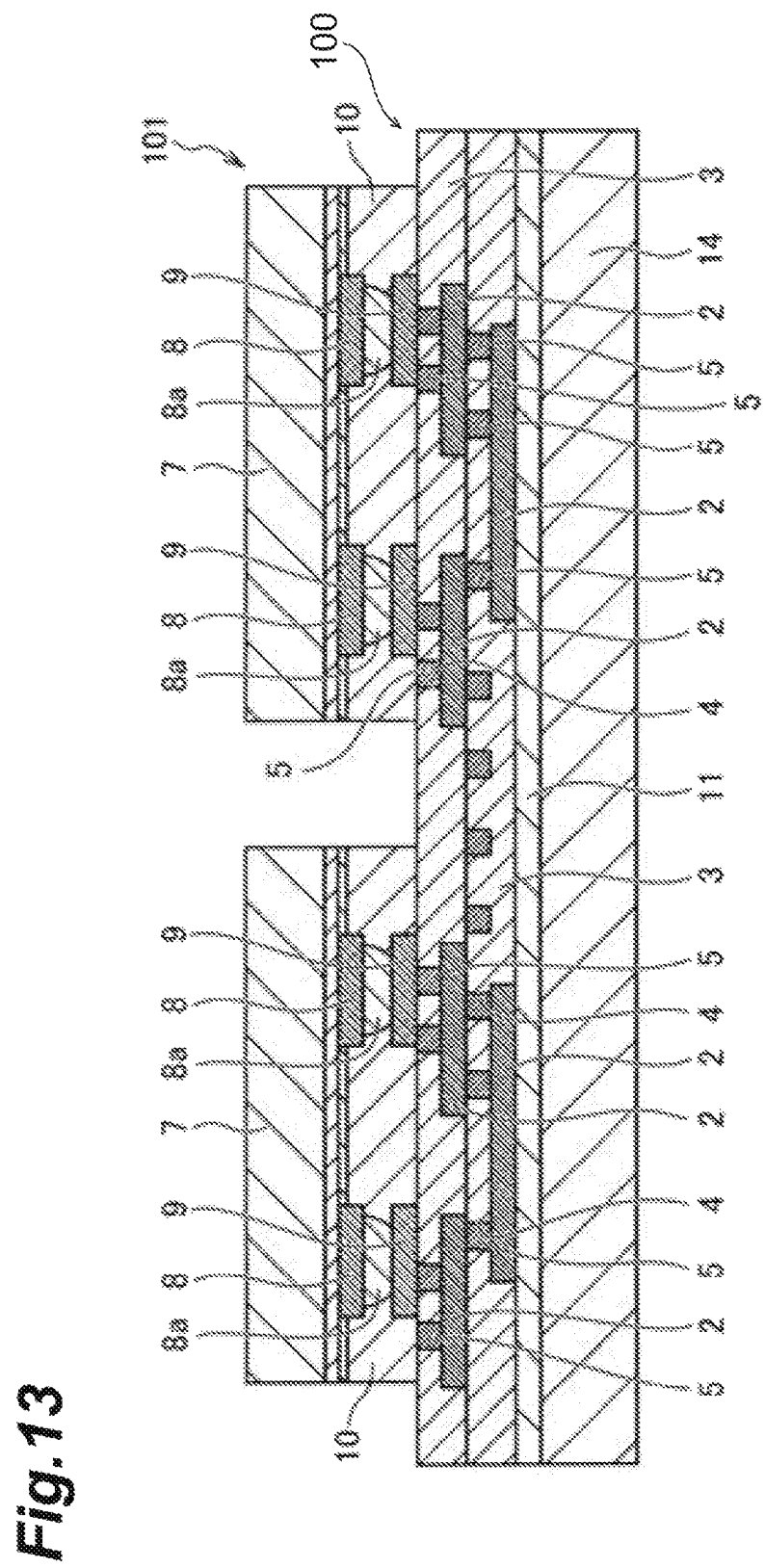
FIG. 13 is a sectional view schematically illustrating a state of mounting a semiconductor element on a high density wiring layer with an underfill material.

Next, as shown in FIG. 13, the semiconductor element 7 is mounted on the resulted high density wiring layer 100 with the underfill material 10.

Note that the high density wiring layer 100 is provided with the electrode 9 described above, and the electrode 9 is electrically connected with the electrode 8 of the semiconductor element 7 through the solder 8a.

Figure 14:
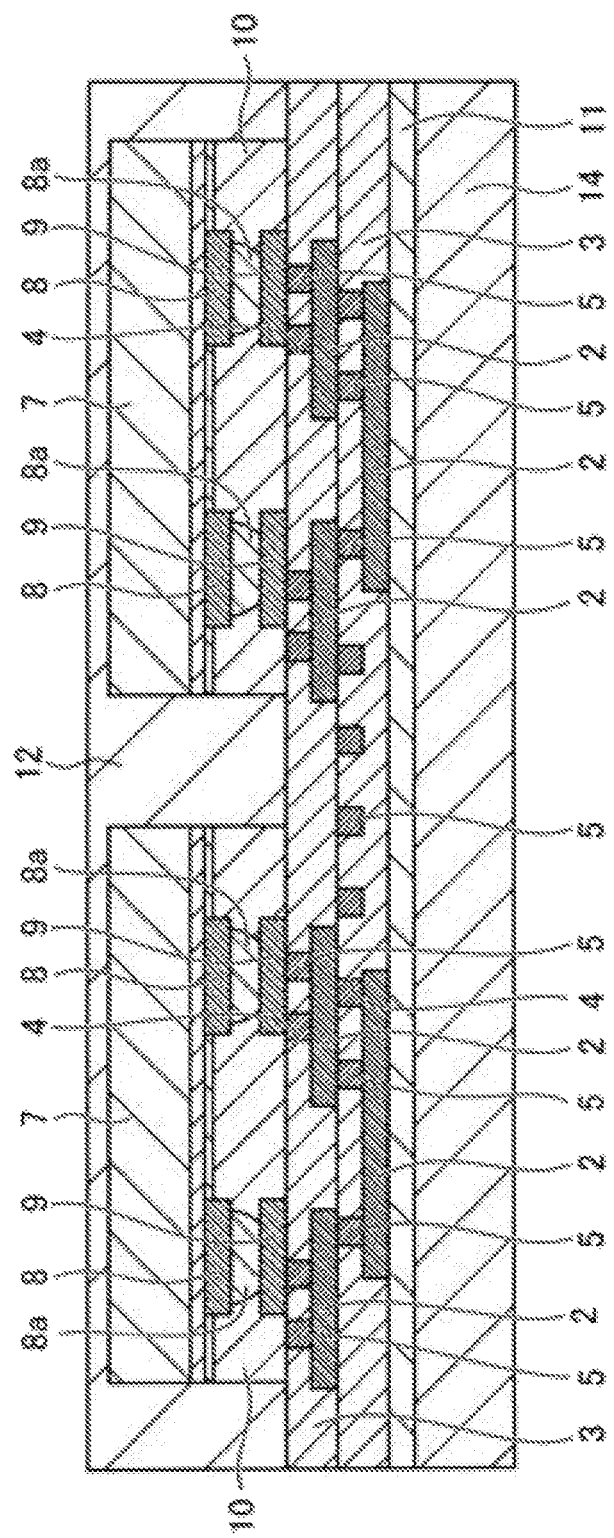
FIG. 14 is a sectional view schematically illustrating a state of sealing in the semiconductor element with an insulating material.

Next, as shown in FIG. 14, the semiconductor element 7 is sealed in with an insulating material 12 (sealing step). The insulating material 12 may be a liquid, solid, or sheet-shaped material. The insulating material 12 may be also served as the underfill material 10.

Figure 15:
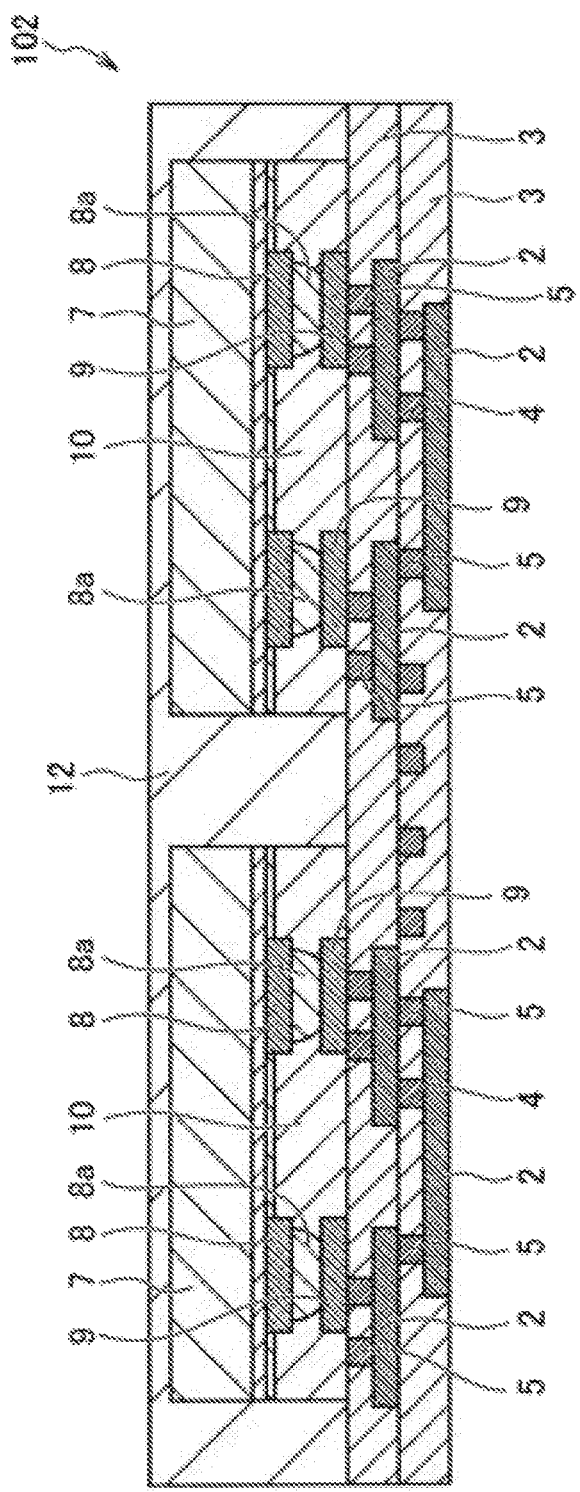
FIG. 15 is a sectional view schematically illustrating a state where the carrier and the temporary fixing layer are peeled from a semiconductor element with a wiring layer.

Next, as shown in FIG. 15, the carrier 14 and the temporary fixing layer 11 are peeled off to obtain a semiconductor element with wiring layer 102. Through the steps described above, a high density semiconductor device excellent in transmission between chips can be produced at a better yield to likely gain economic benefits.

Examples of a method for peeling off the carrier 14 from the high density wiring layer 100 includes peeling, slide peeling, or heat peeling. After peeling off the carrier 14 from the high density wiring layer 100, the high density wiring layer 100 may be washed by a solvent, plasma or the like to remove the remained temporary fixing layer 11.

Before peeling off the carrier 14, a heating process, light irradiation or the like may be performed as a process for increasing the ease of peeling of the temporary fixing layer 11.

The temporary fixing layer 11 may remain on the high density wiring layer 100 so long as it is within a degree not inhibiting a function of the semiconductor device. Note that the peeled carrier 14 may be recycled.

In the semiconductor element with wiring layer 102 from which the carrier 14 and the temporary fixing layer 11 are peeled off, the connection electrode part such as a solder or a copper pad may be newly formed on a surface on which the first copper wiring 2 is exposed. Note that the number of the wiring layers (the first and second copper wirings) may be plural, from a view point of improving transmission density. A plurality of semiconductor elements 7 may be included, from a view point of likely gaining economic benefits.

A method for forming the new connection electrode part is not specifically limited, but a method of applying the copper paste described above and sintering processing the copper paste may be used, for example. In addition, a method using a molten solder or a method in which a resist is formed and subjected to electroplating or electroless plating may be used to form the new connection electrode part. The new connection electrode part may be constituted by a single metal, or may be constituted by a plurality of metals.

The new connection electrode part contains at least any of gold, silver, copper, nickel, indium, palladium, tin, bismuth, or the like, for example.

Next, as shown in FIG. 16, the semiconductor element with wiring layer 102 sealed with the insulating material 12 is cut. This allows the semiconductor element with wiring layer 102 in a state of being sealed with insulating material 12 to be cut into pieces to obtain a plurality of elements 102, more likely gaining economic benefits. Then, the sealed semiconductor elements with wiring layer 102 are respectively mounted on a substrate 13 to produce the semiconductor package 103.

The substrate 13 has a substrate core material 21 including a wiring 24, an insulating layer 22 formed on the substrate core material 21, a substrate connection material 23 exposed from a part of the insulating layer 22 and connected with the wiring 24, for example. On the substrate 13, an underfill material 25 is formed in such a way as to expose the substrate connection material 23. The underfill material 25 is provided between the substrate 13 and the semiconductor element with wiring layer 102, and has a function to relax a stress between the substrate 13 and the semiconductor element with wiring layer 102.

The insulating layer 3 in the semiconductor element with wiring layer 102 and the insulating layer 22 that the substrate 13 has may be constituted by the same material, or may be constituted by different materials. Similarly, the underfill material 10 and the underfill material 25 may be constituted by the same material, or may be constituted by different materials. A linear expansion coefficient of the substrate 13 may be 30 ppm/° C. or less, for example, from a view point of capability of preventing the semiconductor package 103 from warping. It is preferable that the thermal expansion coefficient be 20 ppm/° C. or less from a view point of preventing peeling off or cracking in a temperature cycling test and a reflow step.

Note that in a process for manufacturing a semiconductor device of related art, in a case where the copper paste is used as a material of the copper wiring, there have been a case that adhesion between an organic material (e.g., organic material for forming the insulating layer 3) and the copper paste is insufficient, and a case that a strength of the copper wiring as a sintered body of the copper paste is insufficient. However, by use of the method for manufacturing the semiconductor device according the above embodiment, it is possible to form a copper wiring which can sufficiently exert resistance to reflow, resistance to temperature cycle, flexibility and the like of the copper wiring, and has higher reliability.

Hereinabove, the method for manufacturing the semiconductor device according to the embodiments of the present disclosure is described, but the present disclosure is not necessarily limited to the above described embodiments, and may be adequately modified within a scope not departing from the gist thereof.

In the above embodiments, the copper layer 15 is formed by use of the copper paste, but not limited thereto. For example, the copper layer 15 may be formed by use of at least any of sputtering, electroplating, and electroless plating. Alternatively, the copper layer 15 may be formed by combining at least any of sputtering, electroplating, and electroless plating, and the applying step and sintering step of the copper paste. Note that the copper layer obtained by use of the copper paste and the copper layer obtained by sputtering, plating or the like of related art are considered to be different from each other in a copper density or the like. Therefore, whether or not the copper layer is obtained by use of the copper paste can be determined by observing the sectional view, for example.

In the above embodiments, the trench 4 is formed by directly exposing and developing the insulating layer 3, but not limited thereto. For example, photolithography of the insulating layer 3 may be performed using a resist mask.

REFERENCE SIGNS LIST 1, 13 . . . Substrate, 2 . . . First copper wiring, 3, 22 . . . Insulating layer, 4 . . . Trench, 5 . . . Second copper wiring, 7 . . . Semiconductor element, 8, 9 . . . Electrode, 10, 25 . . . Underfill material, 11 . . . Temporary fixing layer, 12 . . . Insulating material, 14 . . . Carrier, 21 . . . Substrate core material, 23 . . . Substrate connection material, 24 . . .

Wiring, 30 . . . Wiring layer, 100 . . . High density wiring layer (wiring body), 101 . . . Semiconductor package (semiconductor device), 102 . . . Semiconductor element with wiring layer, 103 . . . Semiconductor package (semiconductor device).

The invention claimed is:

1. A method for manufacturing a semiconductor device, comprising:
    forming an insulating layer having a trench above a substrate;
    forming a copper layer on the insulating layer so as to fill the trench with a copper layer part; and
    removing the copper layer on the insulating layer by a fly cutting method so as to retain an exposed copper layer part in the trench and an exposed portion of the insulating layer;
    wherein, after removing the copper layer on the insulating layer, a surface roughness of each of the exposed portion of the insulating layer and the exposed copper layer part is 0.03 µm or more and 0.1 µm or less.

2. The method for manufacturing the semiconductor device according to claim 1,
    wherein in the removing the copper layer, removing a part of the insulating layer by the fly cutting method.

3. The method for manufacturing the semiconductor device according to claim 2,
    wherein the part of the insulating layer is set within 10% of a thickness of the insulating layer.

4. The method for manufacturing the semiconductor device according to claim 3,
    wherein the part of the insulating layer is in a vicinity of an upper surface of the insulating layer and is set within 10% of a thickness of the insulating layer.

5. The method for manufacturing the semiconductor device according to claim 1,
    wherein the insulating layer is formed using a photosensitive resin material, and
    wherein the method further comprises forming the trench on the insulating layer by exposing and developing the insulating layer before the forming the copper layer.

6. The method for manufacturing the semiconductor device according to claim 1,
    wherein the trench has a line width of 0.5 to 5 µm.

7. The method for manufacturing the semiconductor device according to claim 1,
    wherein forming the copper layer includes: applying a copper paste to at least the trench on the insulating layer: and sintering the copper paste to form the copper layer.

8. The method for manufacturing the semiconductor device according to claim 7,
    wherein a volume resistivity of the copper layer after the sintering is 3 to 40 µΩ·cm.

9. The method for manufacturing the semiconductor device according to claim 7,
    wherein in the sintering, the copper paste is heated at 80 to 200° C. in a presence of acid.

10. The method for manufacturing the semiconductor device according to claim 1, further comprising forming a temporary fixing layer on the substrate,
    wherein in forming the insulating layer, the insulating layer is formed on the temporary fixing layer.

11. The method for manufacturing the semiconductor device according to claim 10,
    wherein the temporary fixing layer contains particles being capable of expanding in volume at 200° C. or more.

12. A semiconductor device comprising:
    a substrate;
    a wiring body on the substrate, the wiring body including a plurality of wiring layers stacked on each other; and
    a semiconductor element on the wiring body
    wherein each of the plurality of wiring layers includes an insulating layer having a trench on its first surface side, and a copper wiring filled in the trench, and
    wherein a surface roughness of each of the insulating layers on its first surface side and the copper wiring on its first surface side is 0.03 µm or more and 0.1 µm or less.

13. The semiconductor device according to claim 12,
    wherein a volume resistivity of the copper wiring is 3 to 40 µΩ·cm.

14. The semiconductor device according to claim 12, further comprising:
    an electrode between the wiring body and the semiconductor element, the electrode being electrically connected to the copper wiring and the semiconductor element; and
    an underfill material between the wiring body and the semiconductor element,
    wherein the wiring body and the semiconductor element are fixed by the underfill material.

15. The semiconductor device according to claim 12,
    wherein the substrate includes a main body having an opening and a conductive material filled in the opening, and
    wherein the copper wiring is electrically connected to the conductive material.

16. A semiconductor device comprising:
    a substrate;
    a wiring layer above the substrate; and
    a semiconductor element above the wiring layer,
    wherein the wiring layer includes:
        an insulating layer having a trench located in the insulating layer; and
        a copper wiring filled in the trench, and
    wherein a surface roughness of each of the insulating layer and the copper wiring is 0.03 µm or more and 0.1 µm or less.

17. The semiconductor device according to claim 16,
    wherein a volume resistivity of the copper wiring is 3 to 40 µΩ·cm.

18. The semiconductor device according to claim 16, further comprising:
    an electrode between the wiring layer and the semiconductor element, the electrode being electrically connected to the copper wiring and the semiconductor element; and
    an underfill material between the wiring layer and the semiconductor element,
    wherein the wiring layer and the semiconductor element are fixed by the underfill material.

19. The semiconductor device according to claim 16,
    wherein the substrate includes a main body having an opening and a conductive material filled in the opening, and
    wherein the copper wiring is electrically connected to the conductive material.

* * * * *